United States Patent [19]
Woodman, Jr.

[11] 3,986,533
[45] Oct. 19, 1976

[54] MECHANISM FOR CLINCHING LEADS INWARDLY OR OUTWARDLY

[75] Inventor: Daniel Wayne Woodman, Jr., Beverly, Mass.

[73] Assignee: USM Corporation, Boston, Mass.

[22] Filed: Nov. 26, 1975

[21] Appl. No.: 635,732

[52] U.S. Cl. ............................. 140/105; 29/203 D; 72/325; 140/93 D; 227/155
[51] Int. Cl.² ..................... B21F 1/00; B21D 31/02
[58] Field of Search ................... 140/105, 93 D; 29/203 B, 203 D; 72/325, DIG. 10; 227/155

[56] References Cited
UNITED STATES PATENTS

| | | | |
|---|---|---|---|
| 2,940,083 | 6/1960 | Walsh | 227/155 |
| 3,034,382 | 5/1962 | Hazel | 29/203 D |

*Primary Examiner*—Travis S. McGehee
*Attorney, Agent, or Firm*—Richard B. Megley; Vincent A. White; Carl E. Johnson

[57] ABSTRACT

Mechanism for cutting and clinching leads projecting from circuit boards or the like is operable in two alternative modes: (1) clinching them inwardly, i.e. toward one another, and (2) clinching outwardly. Shifting of one part, a pin, for example, from one operating position in its cut-clinch assembly to another position conveniently converts the device to the operating mode desired.

7 Claims, 9 Drawing Figures

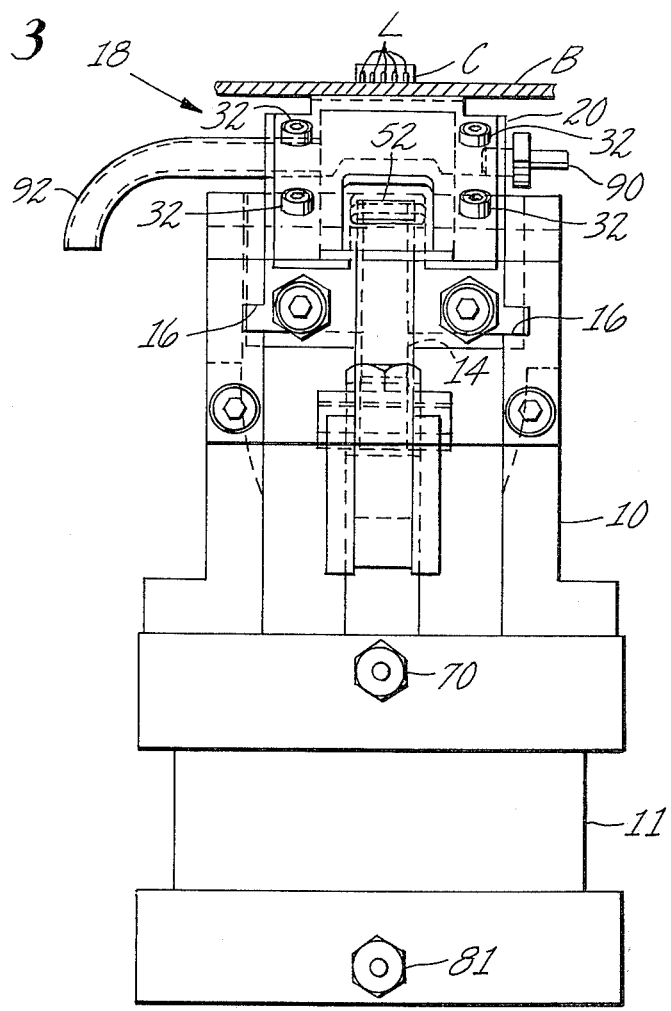
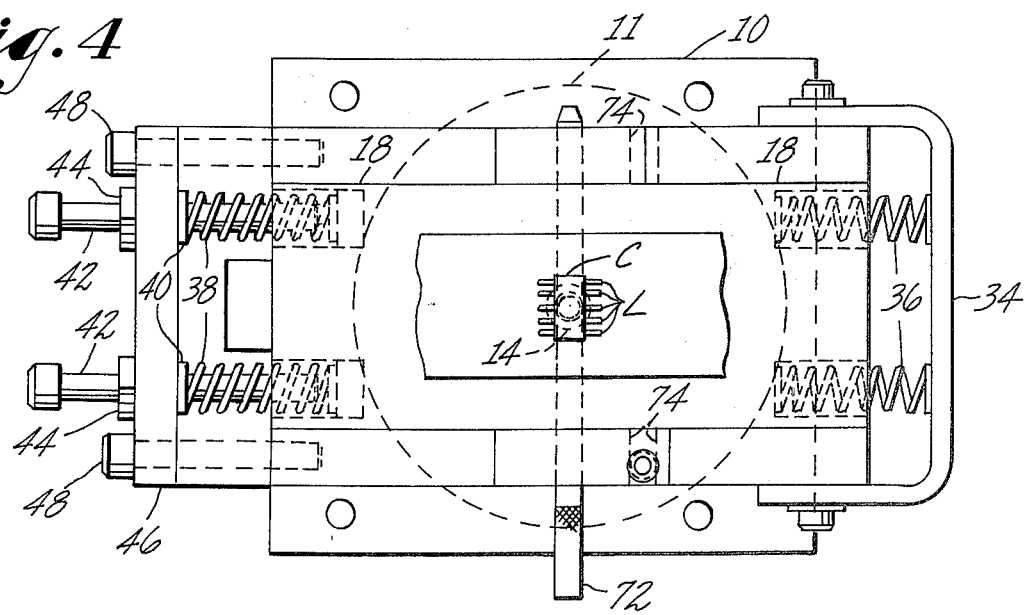

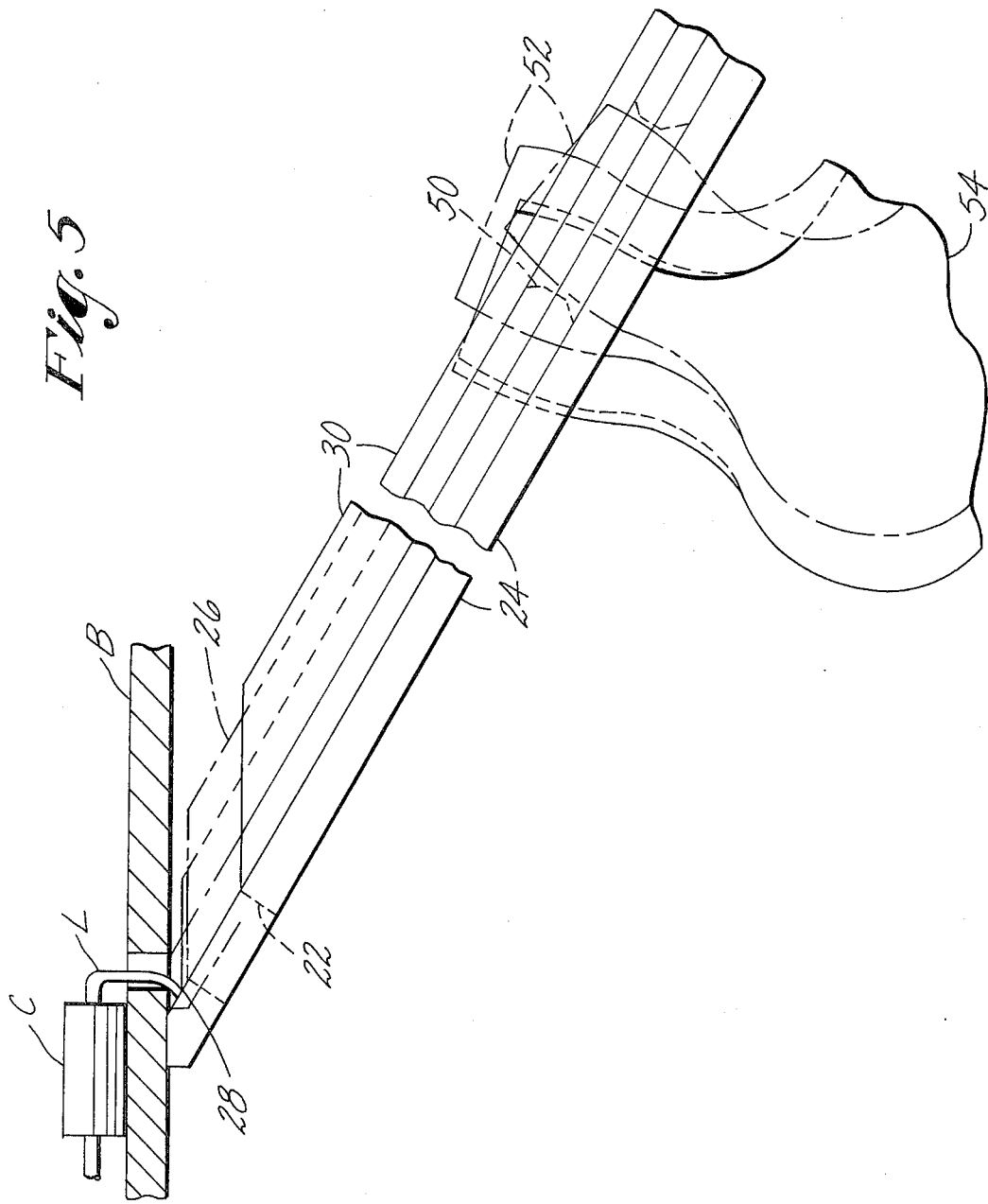

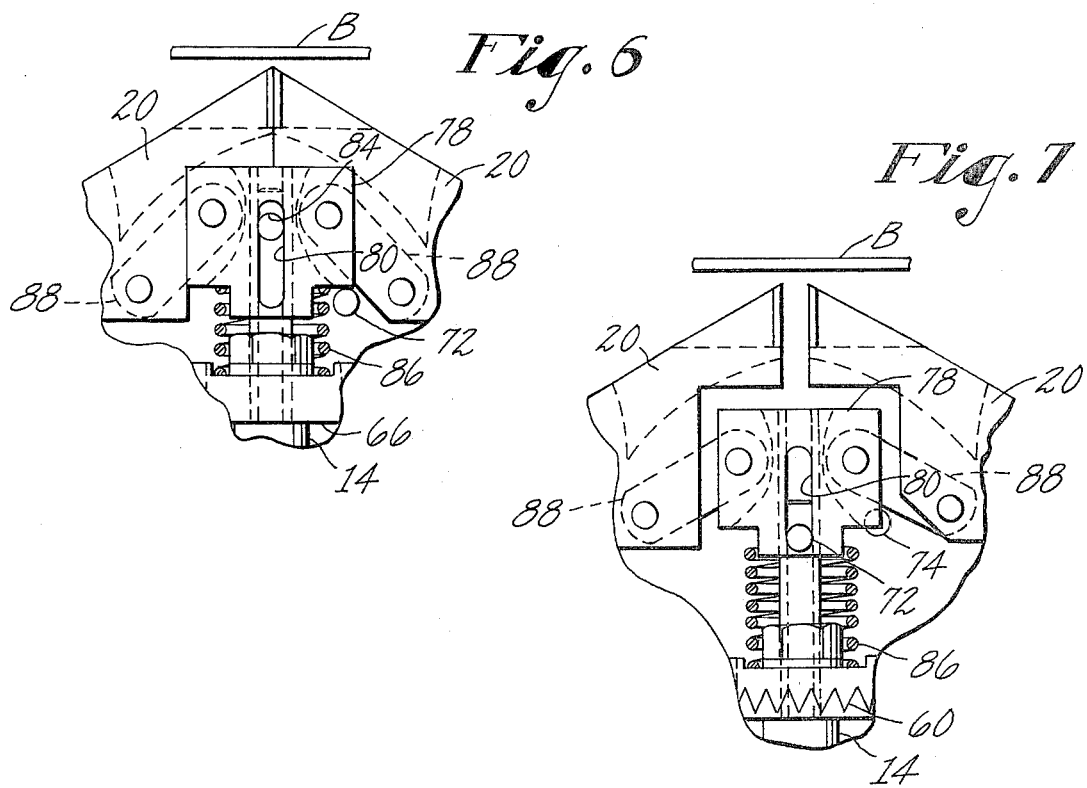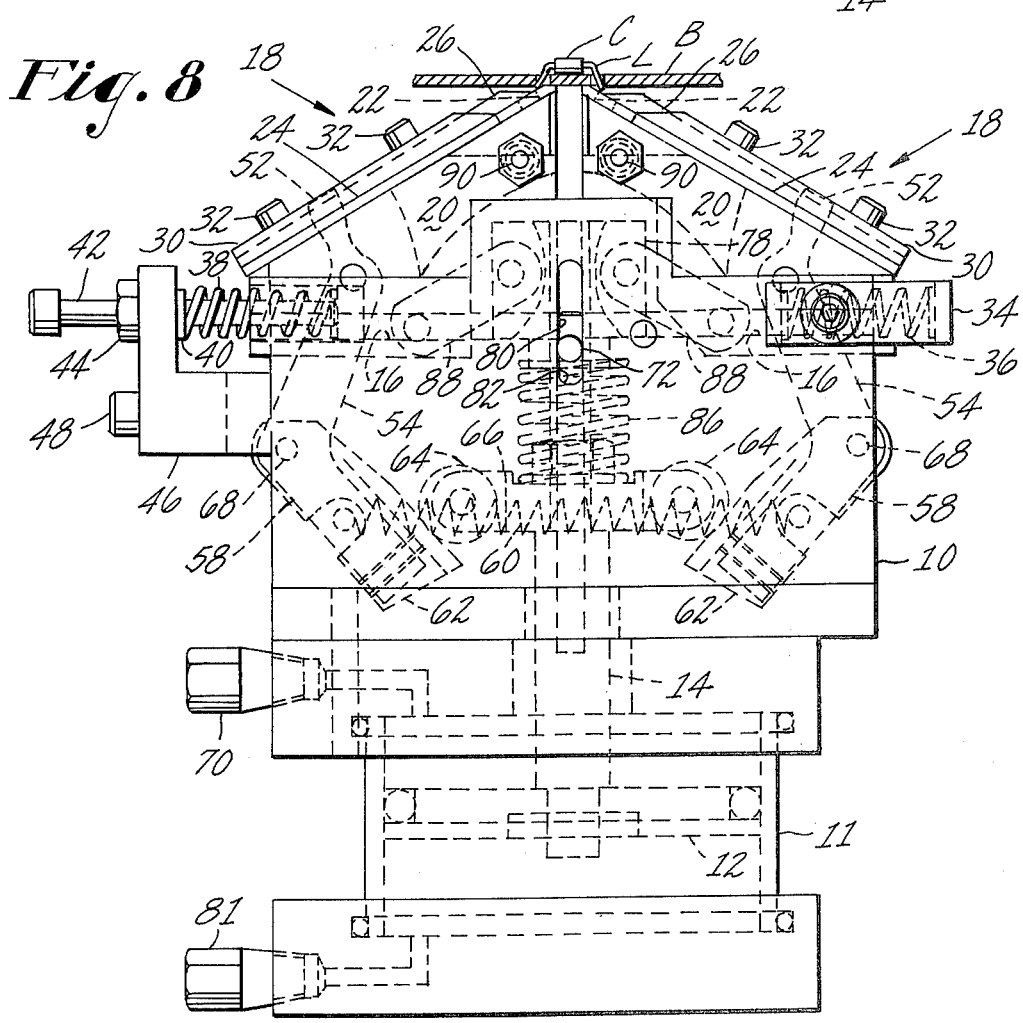

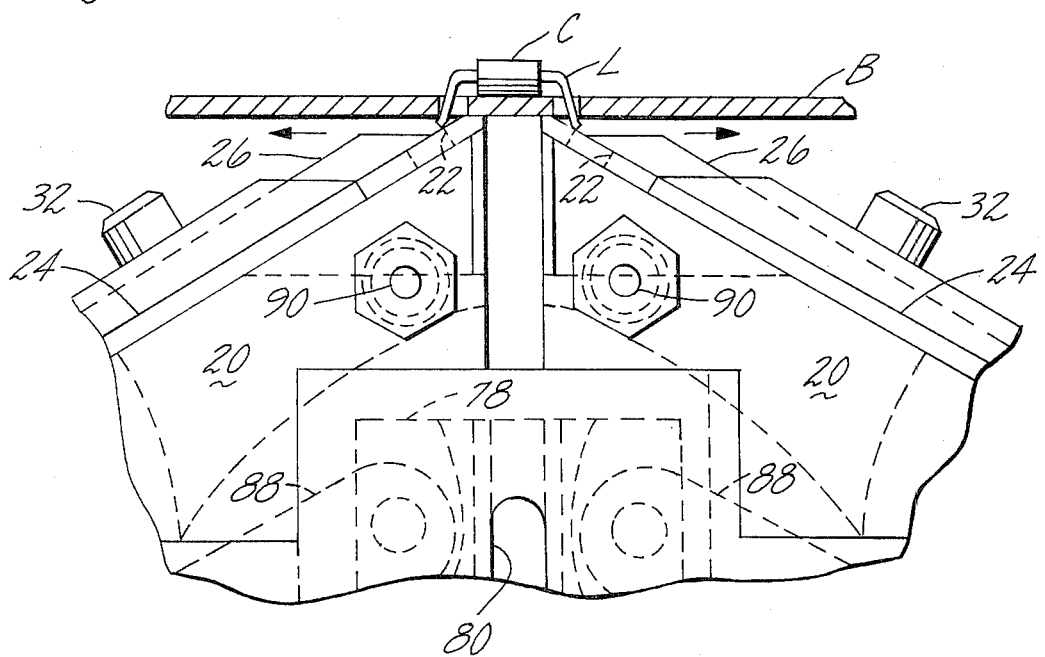

MECHANISM FOR CLINCHING LEADS INWARDLY OR OUTWARDLY

BACKGROUND OF THE INVENTION

The disclosure in U.S. Pat. No. 3,034,382 to Hazel relates to a mechanism for clinching leads inwardly only. In U.S. Pat. No. 3,724,055 there is shown and described a mechanism for clinching leads outwardly only. A. U.S. Pat. No. 3,429,170 discloses the Hazel type of clinching mechanism as modified to permit angular adjustment about a vertical axis. Although U.S. Pat. No. 2,940,083 relates to mechanism for optionally clinching leads inwardly or outwardly, it lacks a means for suitably shearing leads projecting from a circuit board which are then to be clinched in the selected direction. The disclosure of the latter, as well as of other available cut-clinch mechanisms hitherto known, accordingly have been useful in different embodiments but none has been found adequately versatile and of generally suitable construction.

SUMMARY OF THE INVENTION

In view of the foregoing it is an object of this invention to provide, for use with a machine for inserting leads of components through a support such as a circuit board, an improved, versatile cut-clinch mechanism whereby end portions of leads may be severed adjacent to the board and then clinched inwardly or outwardly.

Another object of this invention is to provide an economical, compact cut-clinch mechanism comprising a single optionally shiftable element whereby the mechanism can be conveniently converted from clinching outwardly to clinching inwardly, and vice versa.

To these ends, and as herein shown, the mechanism comprises a support movable towards and from a circuit board and formed with guide means substantially parallel thereto, at least one pair of cut-clinch assemblies laterally movable together and apart, respectively, in the guide means, each assembly including an inclined shear bar for guiding a lead-cutting knife relatively reciprocable thereon, to and from a lead projecting from the board to be cut and clinched, and power means including a latch member operative in one position for operating each of the knives when the assemblies are together to effect lead shearing and inward clinch of the shorn leads by the knives, respectively, said latch member being shiftable to a second position whereby the assemblies are unlatched and laterally separable by the power means after the leads are shorn by the knives to cause the shear bars to clinch the leads outwardly. As herein shown the latch member is a single pin the position of which conveniently controls the optional mode of operation.

BRIEF DESCRIPTION OF THE DRAWINGS

The foregoing and other features of the invention, together with novel details and combinations of parts, will now be more particularly described in connection with a preferred embodiment thereof and with reference to the accompanying drawings, in which:

FIG. 3 is a view in end elevation of the mechanism shown in FIGS. 1 and 2;

FIG. 4 is a plan view of the mechanism shown in FIGS. 1–3 inclusive, but with a latch pin shifted to effect outward instead of inward clinching;

FIG. 5 is an enlarged detail showing a shear bar and one of the knives in FIG. 2 after it has effected inward clinch;

FIG. 6 is another detail in elevation of portions of the cut-clinch assemblies showing the position of a shiftable latch pin enabling the knives to effect inward clinching after lead shearing;

FIG. 7 is a view similar to FIG. 6 but showing how the latch pin is shifted (as in FIG. 4) when outward lead clinching is to be effected;

FIG. 8 is a view corresponding to FIG. 2 except that the latch pin as in FIG. 7 has been actuated to cause outward clinching; and FIG. 9 is a detail illustrating a laterally shifted shear bar effecting outward clinch.

DESCRIPTION OF THE PREFERRED EMBODIMENT

Figure 1:
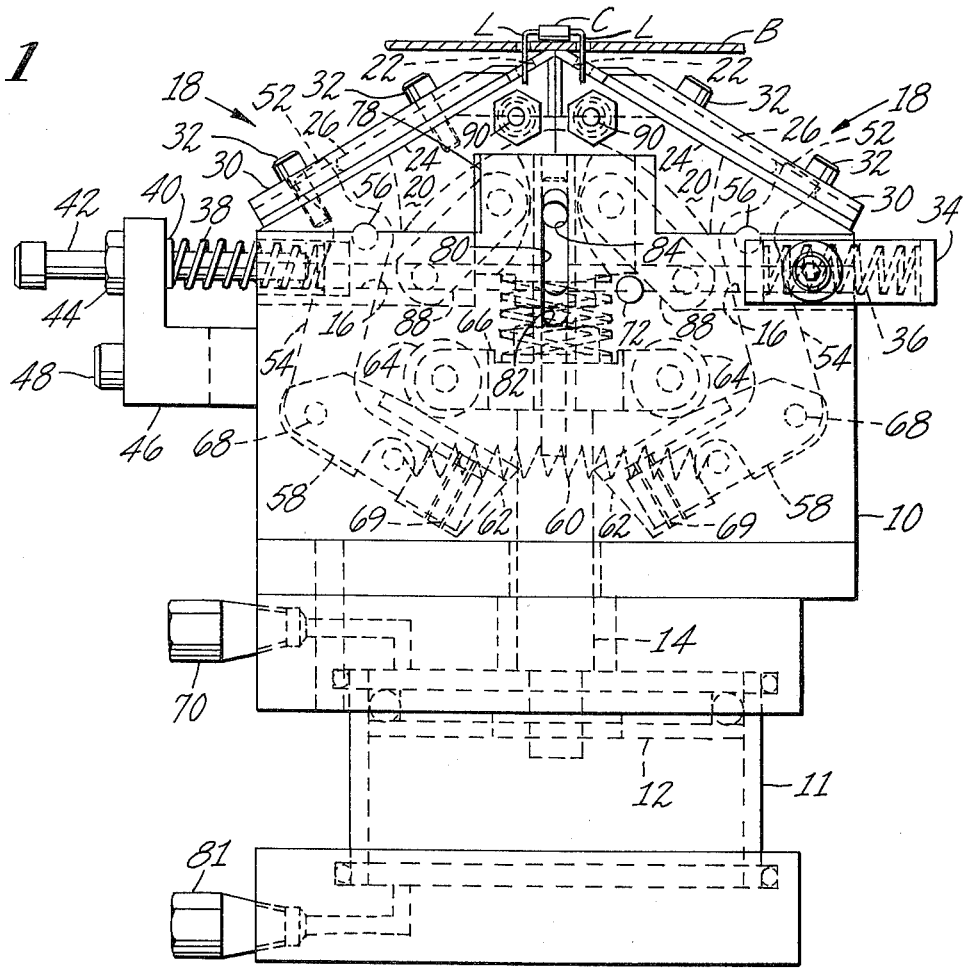
FIG. 1 is a view in side elevation of a dual cut-clinch mechanism in its rest or initial lead-receiving position and adapted for cutting the projecting leads of a component and then clinching them inwardly.

The invention is herein illustrated as employed for cutting and clinching the leads of dual in-line components, sometimes termed "DIP's" and herein designated as comprising a body C (FIGS. 1–5, 8) and leads L, though it will be apparent the invention is equally applicable to processing the leads of disc caps and numerous coaxial lead components which bear leads to be U-formed prior to insertion in wiring boards herein designated B.

The invention will first be described with reference to FIGS. 1–3, and 5 and 6, the cutting-clinching mechanism shown therein being adapted to shear the inserted leads L beneath the circuit board B and then effect their inward clinching. For this purpose a support or housing 10, which may be adjustable heightwise by means not herein shown, includes in its base a power means, for instance a cylinder 11 for guiding a dual acting, fluid pressure operated piston 12 and its piston rod 14. The support 10 is formed with horizontal guideways 16 (FIGS. 1–3) for slidably receiving a pair of cut-clinch assemblies generally designated 18,18. Each of these assemblies 18 comprises a right-triangular anvil 20 formed with an aperture 22 through which an initially inserted lead L to be shorn may depend as in FIG. 1, an inclined stationary shear bar 24, a reciprocable shear 26 having a knife edge at 28 (FIG. 5), and a cover 30 secured by bolts 32 to the anvil to slidably restrain the shear 26 in an inclined path parallel and adjacent to the bar 24.

For inward clinching, as will be described, vertical sides of the anvils 20,20 are maintained substantially stationary and adjacent as shown in FIGS. 1 and 6, but for outward clinching, as later explained, the anvils are laterally yieldingly separable. Accordingly, a U-bracket 34 (FIG. 4) secured to the support 10 confines a pair of compression springs 36,36 which bear endwise on the right hand anvil 20, and similarly, a pair of springs 38,38 bear on the left hand anvil 20. For adjustment of the outboard limit of movement of the left anvil (and hence of the right anvil) each of the springs 38 is carried by a set screw 42 meshing with a nut 44, is engageable endwise with the left anvil 20, through an upturned flange of a bracket 46. The latter is secured to the support 10 as by bolts 48,48.

The shears 26 are simultaneously actuated by mechanism next to be described. Each shear 26 is formed with a closed slot 50 (FIG. 5) for receiving a tooth-like upper end portion 52 of a lever 54 pivoted to an anvil 20 by a pin 56. Lower inwardly inclined arms 58,58 of the levers 54,54 respectively, are interconnected by a tension spring 60 and respectively carry a cam 62. The latter are accordingly maintained in engagement with rolls 64 mounted on a cross bar 66 carried by the piston rod 14. For suitably adjusting each of the knives 28 to operate simultaneously, each cam 62 preferably is pivoted at one end, as at 68, to the lever and the other end of the cam has its under-surface engaged by a set screw threaded 69 (FIG. 1) threaded through the lever 54. Lead trimming is effected by the shears 26 being moved upwardly in unison by the pivoting of the levers 54 about the pins 56 in response to the descent of the piston rod 14 when fluid pressure is admitted to the upper portion of the cylinder 11 via an inlet port 70.

Figure 2:
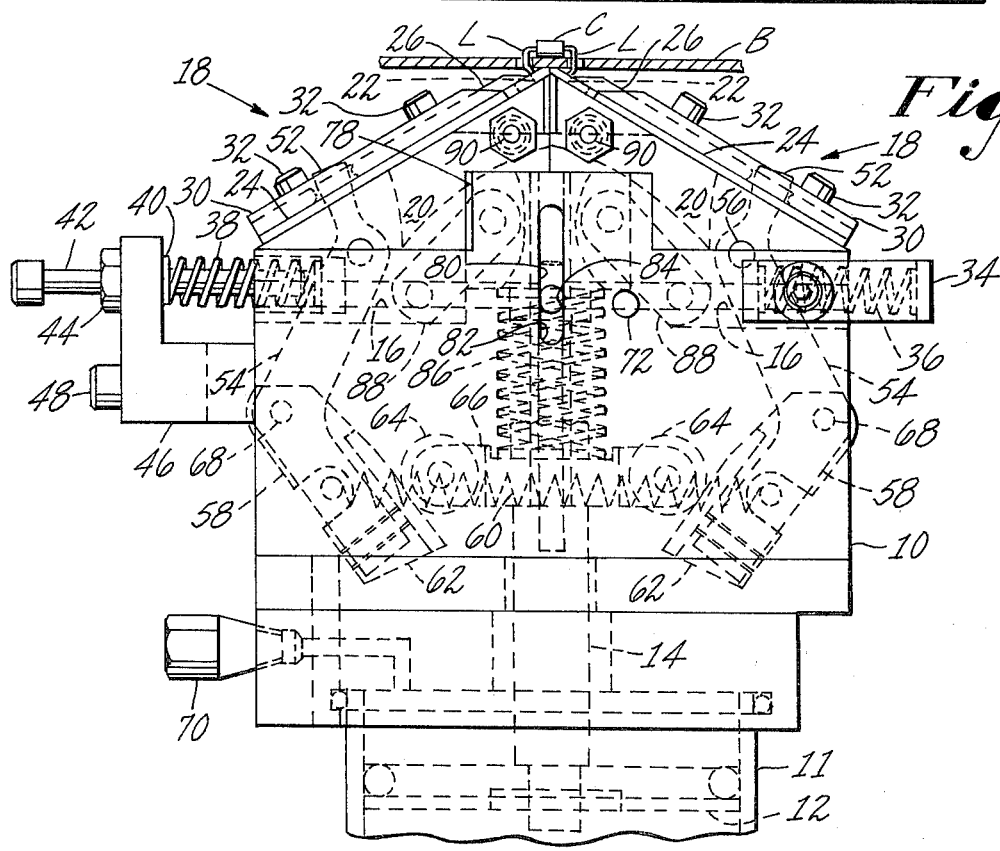
FIG. 2 is a view corresponding to FIG. 1 but showing the parts at a subsequent stage when power means has actuated linkage for operating shearing knives for cutting and inwardly clinching the shorn leads.

For also effecting inward clinch immediately following lead trimming, the shears 26 are caused to continue further upwardly as indicated in FIG. 5 as the piston 12 completes its descent. This is accomplished by securing the anvils 20,20 against lateral separation by means of a latchpin 72 (FIGS. 1,2 & 6) then inserted in aligned bores 74, (FIGS. 4,7) formed in the support 10. Thus located the pin 72 abuts the under side of a bored block 78 slidably mounted on the upper portion of the piston rod 14 and provided with a transverse vertical slot 80 for a purpose hereinafter noted. In completing its descent the piston rod 14 urges the shears 26 inwardly together to clinch the shorn leads as shown in FIG. 5. For returning the piston 12 to the initial up position, pressure is admitted via a port 81 (FIGS. 1 and 2). The tension spring 60 is effective to return the shears 26 to their lower inactive positions.

When desiring to employ the illustrative mechanism in its alternate mode for lead cutting and outward clinching, the latch pin 72 is shifted to extend throught the vertical slot 80 in the block 78, aligned vertical slots 82,82 in the support 10, and through a bore 84 (FIGS. 1,2) formed in the upper end of the piston rod 14, as shown in FIGS. 4,7 and 8. Now the anvils 20,20 are laterally separable as indicated in FIG. 7, and the block 78, instead of being fixed heightwise, is yieldingly supported upon a return spring 86. The latter is confined between the block 78 and the cross bar 66. It will be understood that the power means operates as above described to actuate the shears 26 for trimming the leads L, L, but then as indicated in FIG. 8 the subsequent further descent of the piston rod 14 acts through the latch pin 72 when it has engaged the lower end of the slot 80 to force the block 78 yieldingly downward. Hence a pair of toggle links 88,88 respectively connecting the block 78 to the anvils 20,20 forces the latter apart laterally. Thus, as indicated in FIG. 9, the relatively stationary shear bars 24,24 are separated parallel to the board B and the upper ends of the bars 24 wipe the shorn leads L to clinch them outwardly. Springs 36,38,60 hold anvils 20 from moving while cutting occurs. Fluid pressure admitted via the port 81 returns the piston 12 to its upper position. Spring 60 returns the shears 26. Springs 36,38,60 return anvils 20,20 to their proximal positions. Trimmed off lead ends may be ejected as by air blasts through ducts 90,92 (FIGS. 2,3).

From the foregoing it will be clear that operation of the cut-clinch mechanism is convertible between inward and outward clinching modes according to the selected operating position of the latch pin 72. This pin restrains the anvils 20 against separation during lead cutting and inward clinching of the leads L by the shears 26. Lead cutting is effected in similar manner for inward or outward clinching, but unlatching or shifting the latch pin 72 to its position in the piston rod bore 84 enables the power mechanism and interconnected anvil operating linkage laterally to separate the shear bars 24,24 whereby the shorn leads are clinched outwardly. Thus the mechanism described affords versatile clinching operations. It will be understood that, thought not so shown herein, the cut-clinch mechanism may be adjusted angularly about a vertical axis such as the one passing through the piston rod 14.

Having thus described my invention, what I claim as new and desire to secure by Letters Patent of the United States is:

1. Mechanism for cutting and clinching component leads projecting from a wiring board or the like comprising a support having a guideway parallel to the board, at least one pair of cut-clinch assemblies slidable in the guideway, each of said assemblies comprising an anvil including a stationary shear bar for receiving the projecting leads and a relatively movable shear cooperative with the shear bar, and power means including a member for restraining the assemblies against relative movement in the guideway and operable to cause the shears to trim the leads and then clinch the shorn leads inwardly, said member being shiftable to an alternate operating position whereby said assemblies are yieldingly separable laterally in the guideway to enable the shear bars to clinch the leads outwardly following their trimming by said shears.

2. Mechanism as in claim 1 wherein said shiftable member is a latch pin.

3. Mechanism as in claim 2 wherein the power means comprises a fluid pressure operated piston rod and linkage actuatable by the rod for operating the shears, said latch pin being insertable in said support to cause the shears to trim the leads and then clinch them inwardly, and the latch pin being alternatively connectable to the rod to cause other linkage to force the shear bars apart when the leads have been shorn whereby the shorn leads are clinched outwardly.

4. Mechanism for cutting and clinching component leads projecting from a wiring board comprising a support, at least one pair of cut-clinch assemblies mounted on the support for relative lateral movement together and apart, each of said assemblies including a pair of cooperative shears either one of which shears is operable as a clinching means when the leads have been shorn thereby, and power means operable in optional modes for causing one of the shears to clinch the shorn leads outwardly and the other of the shears to clinch the shorn leads inwardly.

5. Cutting and clinching mechanism operable on spaced, projecting leads of a component comprising a pair of laterally opposed cut-clinch assemblies, each of the assemblies comprising a laterally movable support, lead trimming and clinching means operable in an inclined guideway of the support, linkage connected to each of the lead trimming and clinching means for simultaneously causing the leads to be cut before they are clinched, power means for actuating the linkage, optional means for releasably latching the cut-clinch assemblies against lateral movement when the power means effects lead clinching in one lateral direction, and other mechanism operable by the power means when said optional means has released said assemblies from latched relation to effect lead clinching in another lateral direction.

6. A device for cutting and clinching the projecting ends of component leads comprising a pair of right-triangular supports having their vertical sides adjacent and laterally movable apart, a fixed shear bar and relatively slidable shear mounted on the inclined sides, respectively, of the supports, fluid pressure operating means including a piston rod operatively connected to said slidable shears to effect trimming of the leads and inward clinching thereof when said vertical sides are proximate, means yieldingly restraining said supports against relative lateral separation, and mechanism optionally connectable to the piston rod for forcing the shear bars laterally apart against the influence of said restraining means whereby the leads, when shorn by the slidable shears, are clinched outwardly by lateral separation of, said bars.

7. A device as in claim 6 wherein said mechanism includes a pair of toggle links corresponding ends of which are connected to the supports and opposite ends of the links are operatively connected to the rod.

* * * * *